(12) United States Patent
Lee

(10) Patent No.: US 6,352,934 B1
(45) Date of Patent: Mar. 5, 2002

(54) SIDEWALL OXIDE PROCESS FOR IMPROVED SHALLOW JUNCTION FORMATION IN SUPPORT REGION

(75) Inventor: Heon Lee, Fishkill, NY (US)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/383,666

(22) Filed: Aug. 26, 1999

(51) Int. Cl.[7] .............................................. H01L 21/302
(52) U.S. Cl. ....................... 438/704; 438/710; 438/712; 438/723; 438/745
(58) Field of Search ................................ 438/712, 723, 438/710, 745, 704

(56) References Cited

U.S. PATENT DOCUMENTS

| | | | | |
|---|---|---|---|---|
| 4,085,498 A | * | 4/1978 | Rideout | 29/571 |
| 4,577,391 A | * | 3/1986 | Hsia et al. | 29/571 |
| 5,023,203 A | * | 6/1991 | Choi | 437/228 |
| 5,423,941 A | * | 6/1995 | Komura et al. | 156/643.1 |
| 5,492,858 A | * | 2/1996 | Bose et al. | 437/67 |
| 5,550,078 A | * | 8/1996 | Sung | 437/52 |
| 5,821,139 A | * | 10/1998 | Tseng | 438/239 |

* cited by examiner

Primary Examiner—Benjamin L. Utech
Assistant Examiner—Vanessa Perez-Ramos

(57) ABSTRACT

A method for forming dielectric protection in different regions of a semiconductor device, in accordance with the present invention, includes forming structures in a first region and a second region. A dielectric layer is grown on surfaces of the structures and in between the structures in the first region and the second region. The dielectric layer is damaged in the second region to provide an altered layer which is etchable at a faster rate than the dielectric layer in the first region. The dielectric layer in the first region and the altered layer in the second region are etched to provide a dielectric protection layer having a first thickness in the first region and a second thickness in the second region.

27 Claims, 4 Drawing Sheets

SIDEWALL OXIDE PROCESS FOR IMPROVED SHALLOW JUNCTION FORMATION IN SUPPORT REGION

BACKGROUND

1. Technical Field

This disclosure relates to semiconductor fabrication and more particularly, to a method for forming dual sidewall oxides for shallow junction formation.

2. Description of the Related Art

Semiconductor memories typically include an array region and a support region. The array region includes a memory array comprising a plurality of memory cells. Each memory cell includes a capacitor for storing a digital bit. The capacitor of the memory cell is typically written to or read from by switching on an access transistor which connects the capacitor to a bitline. The access transistor is often enabled by activating a wordline which functions as the transistor gate. The transistor gates (or wordlines) are formed in both the array region and the support region.

The support region includes "support" components and circuitry needed for the operation of the memory chip. The support region includes transistor devices which also include gates. Gate structures for both the array region and the support region are fabricated simultaneously. However, there are differences between the requirements of the gates in the array region and the gates of the support region. For example, an oxide layer may be formed on lateral surfaces of the gate structures for curing etch damage and forming bird beak structures (i.e., rounding sharp corners). A thinner oxide layer is needed in the support region for shallow junction formation and a thicker oxide is needed in the array region. The thicker oxide in the array region expends some amount of thermal budget. Typically, the thick oxide layer on surfaces of the gate structures in the array region and the thin oxide layer on surfaces of the gate structures in the support region are formed in separate steps.

Therefore, a need exists for a method for providing a single oxidation process for both an array region and a support region for a semiconductor device.

SUMMARY OF THE INVENTION

A method for forming dielectric protection in different regions of a semiconductor device, in accordance with the present invention, includes forming structures in a first region and a second region. A dielectric layer is grown on surfaces of the structures and in between the structures in the first region and the second region. The dielectric layer is damaged in the second region to provide an altered layer which is etchable at a faster rate than the dielectric layer in the first region. The dielectric layer in the first region and the altered layer in the second region are etched to provide a dielectric protection layer having a first thickness in the first region and a second thickness in the second region.

In other methods, the first region may be an array region and the second region may be a support region, and the first thickness may be greater than the second thickness. The step of growing a dielectric layer on surfaces may include the step of growing an oxide layer on sidewalls of the structures and in between the structures. The step of damaging the dielectric layer in the second region to provide an altered layer may include the step of exposing the dielectric layer in the second region to a plasma condition. The plasma condition may include a HBr/O$_2$ reactive ion etch. The plasma condition preferably smooths a surface of the dielectric layer in the second region. The step of damaging the dielectric layer in the second region to provide an altered layer may include the step of illuminating the dielectric layer in the second region with radiation. The radiation may include ultraviolet radiation. The step of etching the dielectric layer may include the step of etching with hydrofluoric acid.

In accordance with the invention, a method for forming dielectric protection in different regions of a semiconductor device includes forming structures in a first region and a second region, growing a first dielectric layer on surfaces of the structures and in between the structures in the first region and the second region, and damaging the first dielectric layer in the second region to provide an altered layer which is etchable at a faster rate than the first dielectric layer in the first region. The first dielectric layer is etched in the first region to provide a first thickness in the first region. The altered layer is etched to remove the altered layer from the second region. A second dielectric layer is grown having a second thickness in the second region such that the first region includes the first thickness of the first dielectric layer and the second thickness of the second dielectric layer.

In other methods, the first region may be an array region and the second region may be a support region. The first dielectric layer and the second dielectric layer may include an oxide layer. The step of damaging the first dielectric layer in the second region to provide an altered layer may include the step of exposing the first dielectric layer in the second region to a plasma condition. The plasma condition may includes a HBr/O$_2$ reactive ion etch. The plasma condition preferably smooths a surface of the first dielectric layer in the second region. The step of damaging the first dielectric layer in the second region to provide an altered layer may include the step of illuminating the first dielectric layer in the second region with radiation. The radiation may include ultraviolet radiation. The step of etching may include the step of etching with hydrofluoric acid.

In accordance with the invention, a method for forming protective oxides in an array region and a support region of a semiconductor memory includes providing a semiconductor substrate having a gate oxide layer formed thereon, patterning gate stacks in the support region and in the array region and oxidizing the gate stacks and the gate oxide layer to form a sidewall oxide on lateral surfaces of the gate stacks and increase a thickness of the gate oxide layer between the gate stacks. A resist is formed over the array region, and the sidewall oxide and the gate oxide layer are damaged in the support region to provide an altered layer which is etchable at a faster rate than the sidewall oxide and the gate oxide layer in the array region. The resist is removed, and the sidewall oxide and the gate oxide layer are etched in the array region and the altered layer in the support region to provide a dielectric protection layer having a first thickness in the array region and a second thickness in the support region.

The first thickness is preferably greater than the second thickness. The step of damaging the sidewall oxide and the gate oxide layer in the support region to provide an altered layer may include the step of exposing the sidewall oxide and the gate oxide layer in the support region to a plasma condition. The plasma condition may include a HBr/O$_2$ reactive ion etch. The plasma condition preferably smooths a surface of the sidewall oxide and the gate oxide layer in the support region. The step of damaging the sidewall oxide and the gate oxide layer in the support region to provide an altered layer may include the step of illuminating the sidewall oxide and the gate oxide layer in the support region with radiation. The radiation may include ultraviolet radiation. The step of etching may include the step of etching with hydrofluoric acid.

These and other objects, features and advantages of the present invention will become apparent from the following detailed description of illustrative embodiments thereof, which is to be read in connection with the accompanying drawings.

BRIEF DESCRIPTION OF DRAWINGS

This disclosure will present in detail the following description of preferred embodiments with reference to the following figures wherein.

DETAILED DESCRIPTION OF PREFERRED EMBODIMENTS

The present invention relates to semiconductor fabrication and more particularly, to a method for forming dual sidewall oxides for shallow junction formation. Since a thinner oxide layer is needed in a support area for shallow junction formation, a process flow for a dual sidewall oxide process (thinner oxide in the support area) is provided in accordance with the present invention. The present invention provides a lithography step which covers the array region and a plasma exposure or UV illumination of an oxide formed in the support region. A cleaning step is performed on a sidewall oxide and a gate oxide in the support region which enables the dual sidewall oxide process (support and array regions). The roughness at the oxide surface is advantageously smoothed by the plasma exposure and the cleaning step.

Figure 1:
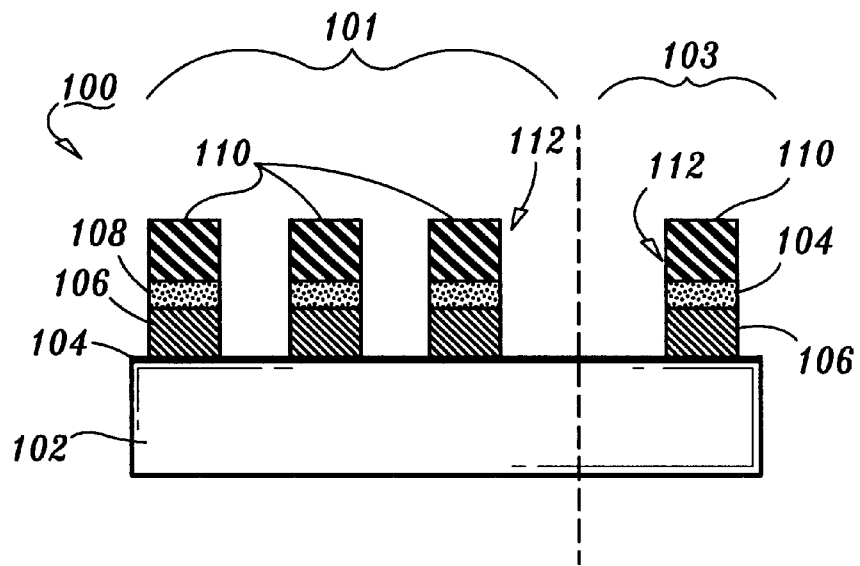
FIG. 1 is a cross-sectional view of a semiconductor device showing gate structures formed for processing in accordance with the present invention.

Referring now in specific detail to the drawings in which like reference numerals identify similar or identical elements throughout the several views, and initially to FIG. 1, a semiconductor device 100 is shown. Semiconductor device 100 preferably includes a semiconductor memory, such as a dynamic random access memory (DRAM). Other semiconductor devices may also employ the present invention, for example embedded DRAM, processors, application specific chips and the like. A substrate 102 is provided which preferably includes silicon although other substrates may be employed, for example, a silicon on insulator substrate. Device 100 is divided into an array region 101 and a support region 103.

A thermally grown insulation layer is formed over substrate 102 and is referred to generally as gate oxide 104 or gate oxide layer (which also refers to areas not used as that gate oxide). A gate conductor layer 106 is deposited on gate oxide 104. Gate conductor 106 may include polysilicon. A conductive layer 108 may be deposited on gate conductor 106. Conductive layer 108 preferably includes a material which has a higher conductivity than gate conductor 106. Conductive layer 108 is formed to improve the conductivity of gate conductor 106. Conductive layer 108 may include a metal silicide, for example tungsten silicide. An etch mask 110 is formed on conductive layer 108. Etch mask 110 may include, for example, silicon nitride. Etch mask 110 is patterned in accordance with conventional techniques, for example, by employing photo lithography techniques. Etch mask 110 is then employed to form gate stacks 112 in both array region 101 and support region 103.

Figure 2:
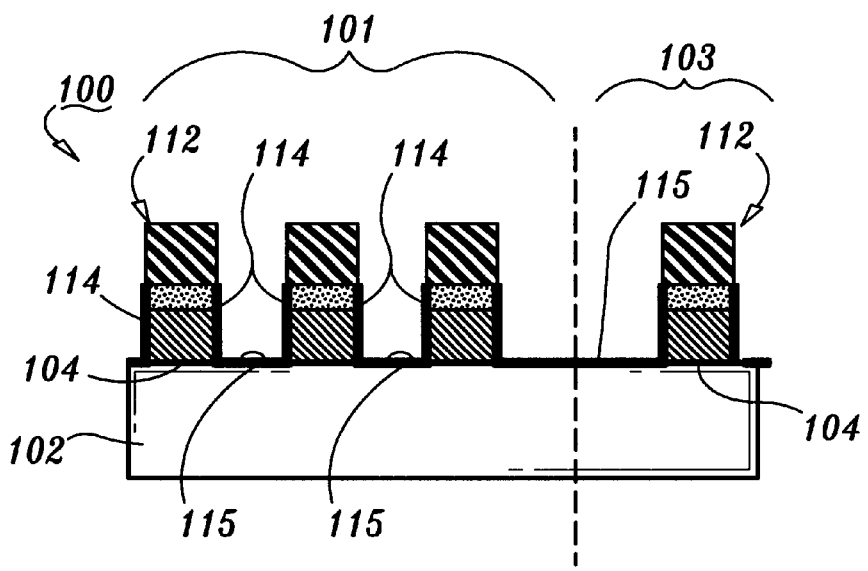
FIG. 2 is a cross-sectional view of the semiconductor device of FIG. 1 showing a sidewall oxide formed in accordance with the present invention.

Referring to FIG. 2, an oxidation process is employed to form oxidation 114 on sidewall lateral surfaces of gate stacks 112, and horizontal surfaces 115 which simultaneously increases gate oxide 104 in thickness. Oxidation 114 occurs in both array region 101 and support region 103. Oxidation 114 has a thickness of between about 20 nm and about 40 nm. Advantageously, this is thicker than conventional side wall oxides formed on gate structures.

Figure 3:
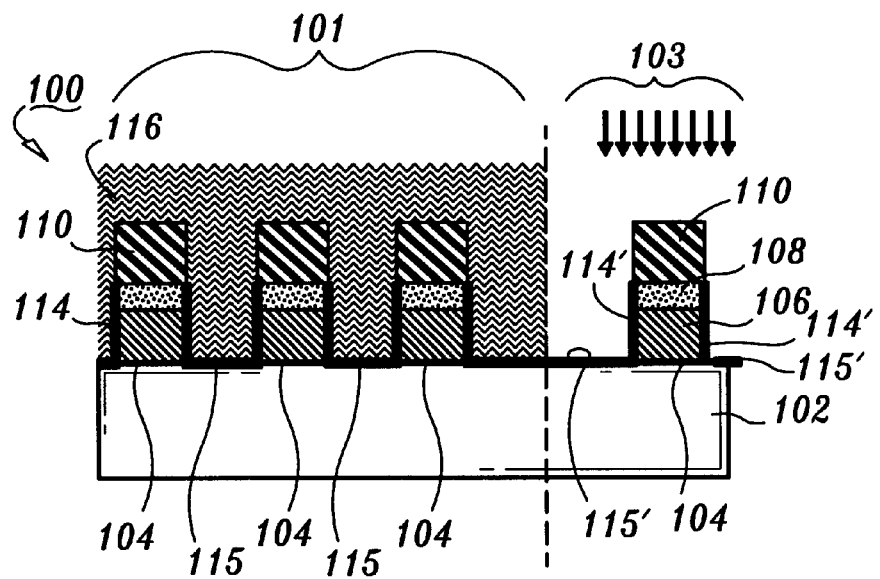
FIG. 3 is a cross-sectional view of the semiconductor device of FIG. 2 showing a resist formed over the array region for subjecting the oxide in the support region to damage to increase etch rate in accordance with the present invention.

Referring to FIG. 3, a resist 116 is spun onto device 100 in both support region 103 and array region 101. Resist 116 is exposed to light (preferably ultraviolet light) and developed only in array region 101. This leaves support region 103 structures exposed and protects array region 101 structures. Sidewall oxidation 114 in support region 103 is damaged to form an altered oxide 114' and 115'. Altered oxide 114' may be formed by exposing oxidation 114 to ultraviolet radiation or exposing oxidation 114 to plasma etching. In a preferred embodiment, a HBr/$O_2$ plasma reactive ion etch is employed to alter oxide 114' and 115'. In a particularly useful method, plasma treatment of oxidation 114 and 115 is employed for between about 3 seconds to about 150 seconds with 30 sccm of HBr, 3 sccm of $O_2$ and 150 sccm of He at a pressure of about 30 milliTorr. Other plasmas may be used and are also contemplated by the present invention. Also, other radiation types may be employed to damage the oxide. For example, X-rays may be used.

Figure 4:
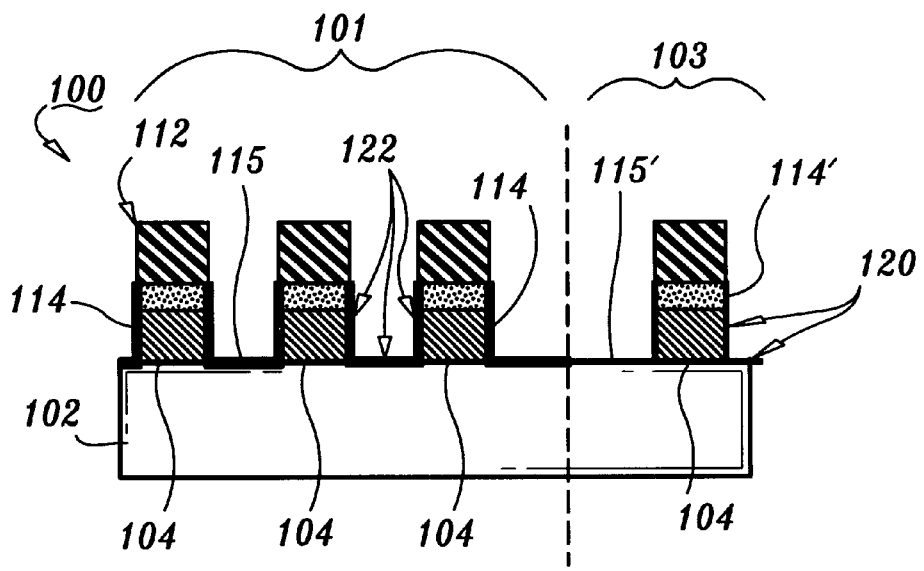
FIG. 4 is a cross-sectional view of the semiconductor device of FIG. 3 showing the sidewall oxide and the gate oxide etched in accordance with one embodiment of the present invention.

Referring to FIG. 4, after plasma exposure, radiation illumination or other processes for forming altered oxide 114' and 115' of support region 103, resist 116 is removed preferably by a wet strip process, and device 100 is then cleaned. Cleaning is preferably performed by employing an etch process such as an HF wet etch. In a preferred method a diluted HF solution dip is employed to clean oxidation 114 and 115 in array region 101 and oxide 114' and 115' of support region 103. Oxide 114' and 115' etching is enhanced by the damage incurred during plasma exposure or radiation illumination, as described above. Advantageously, more oxide is removed in support region 103, than in array region 101 during the cleaning process. If a 100:1 diluted HF solution is employed at about room temperature, for example, the cleaning and etching process is performed for between 20 seconds and 160 seconds.

In accordance with the invention, a thinner oxide layer 120 is provided in support region 103 for shallow junction formation. Also, a thick oxide 122 is formed in array region

101. These oxides provide curing of etch damage and bird beak formation in gate stacks in array region 101. A thinner oxide is desirable in the support region for the formation of shallow junction formation. During the junction formation, which usually include ion implantation, an oxide layer on the surface of the substrate acts as a blocking layer. To penetrate relatively thick oxides, higher energy ions are needed. However, high energy ions make it difficult to form shallow junctions. Also since the dopant loss at the oxide layer is proportional to the thickness of the oxide layer, a higher dose is necessary to compensate the more dopant loss of a thicker oxide.

Surface roughness of a typical grown oxide includes a root mean square (RMS) value of approximately 0.162 nm as measured in one experiment performed by the inventor using an atomic force microscope (AFM). The roughness of the oxide surface is advantageously smoothed by the plasma exposure and the cleaning step as described above. After exposing the grown oxide to the plasma step described above, the surface roughness was measured to be about 0.087 nm RMS. This is due to faster etching at surface peaks and preferred deposition surface valleys thereby decreasing surface roughness. Surface roughness of plasma exposed oxide is not changed by the cleaning step if HF is employed unless UV illumination is employed rather than the plasma exposure. Then, the surface roughness is decreased. After the cleaning step, the surface roughness measured about 0.089 nm RMS. This is a significant improvement over the grown oxide surface roughness. Surface roughness is often a catalyst to electrical failures in semiconductor devices. Therefore, reducing the surface roughness improves reliability of the semiconductor devices. It Is to be understood that the values of surface roughness are illustrative and that improvements can be realized with other surface roughness values which may be less than or greater than the values set forth herein.

Figure 5:
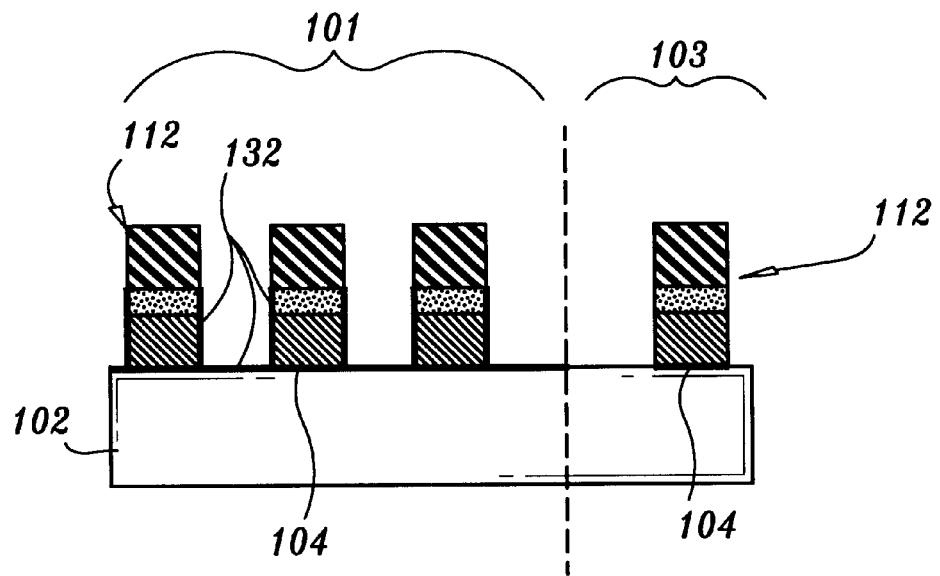
FIG. 5 is a cross-sectional view of the semiconductor device of FIG. 3 showing the sidewall oxide and the gate oxide etched in accordance with another embodiment of the present invention.
Figure 6:
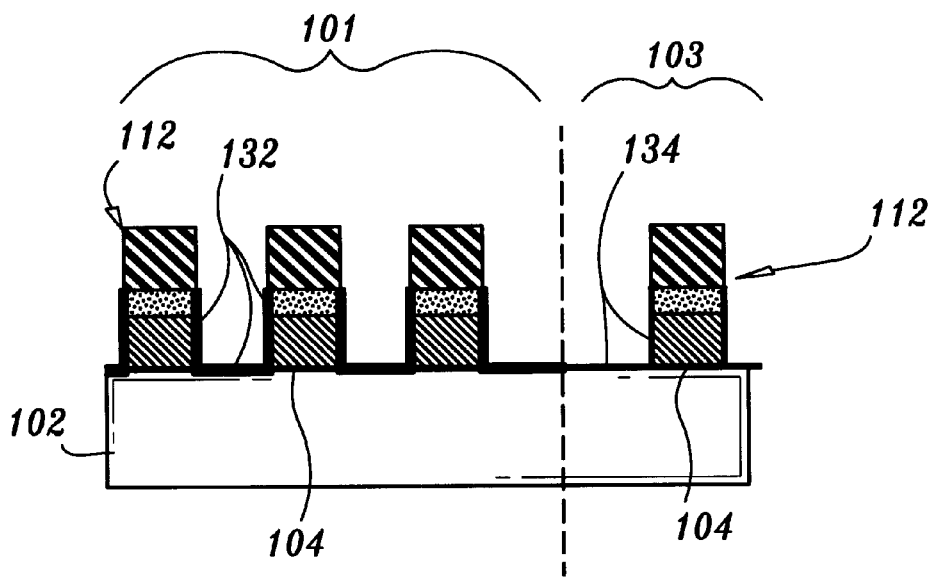
FIG. 6 is a cross-sectional view of the semiconductor device of FIG. 5 showing an additional oxide formed in accordance with the present invention.

Referring to FIGS. 5 and 6, in an alternative method of the present invention, oxide layer 114' and 115' (FIG. 3) in support region 103 are completely removed by the cleaning or etching step as shown in FIG. 5. Since the oxide in oxide layer 114' and 115' is altered, the altered oxide etches at a faster rate than oxide layer 132 in array region 101. An additional oxidation step is employed to obtain a desired thickness of an oxide 134 in the support region 103 as shown in FIG. 6. Since oxide 132 in array region 101 is not completely removed during the cleaning/etching process, a thicker oxide layer is formed (a cumulative oxide is formed which includes the previous thickness plus the oxide of the second oxidation process) than the oxide layer 134 in support region 103. Since the oxide thickness in support region 103 can be independently controlled using this method, a thicker sidewall oxide can be grown for any purpose without interrupting shallow junction formation in support region.

Figure 7:
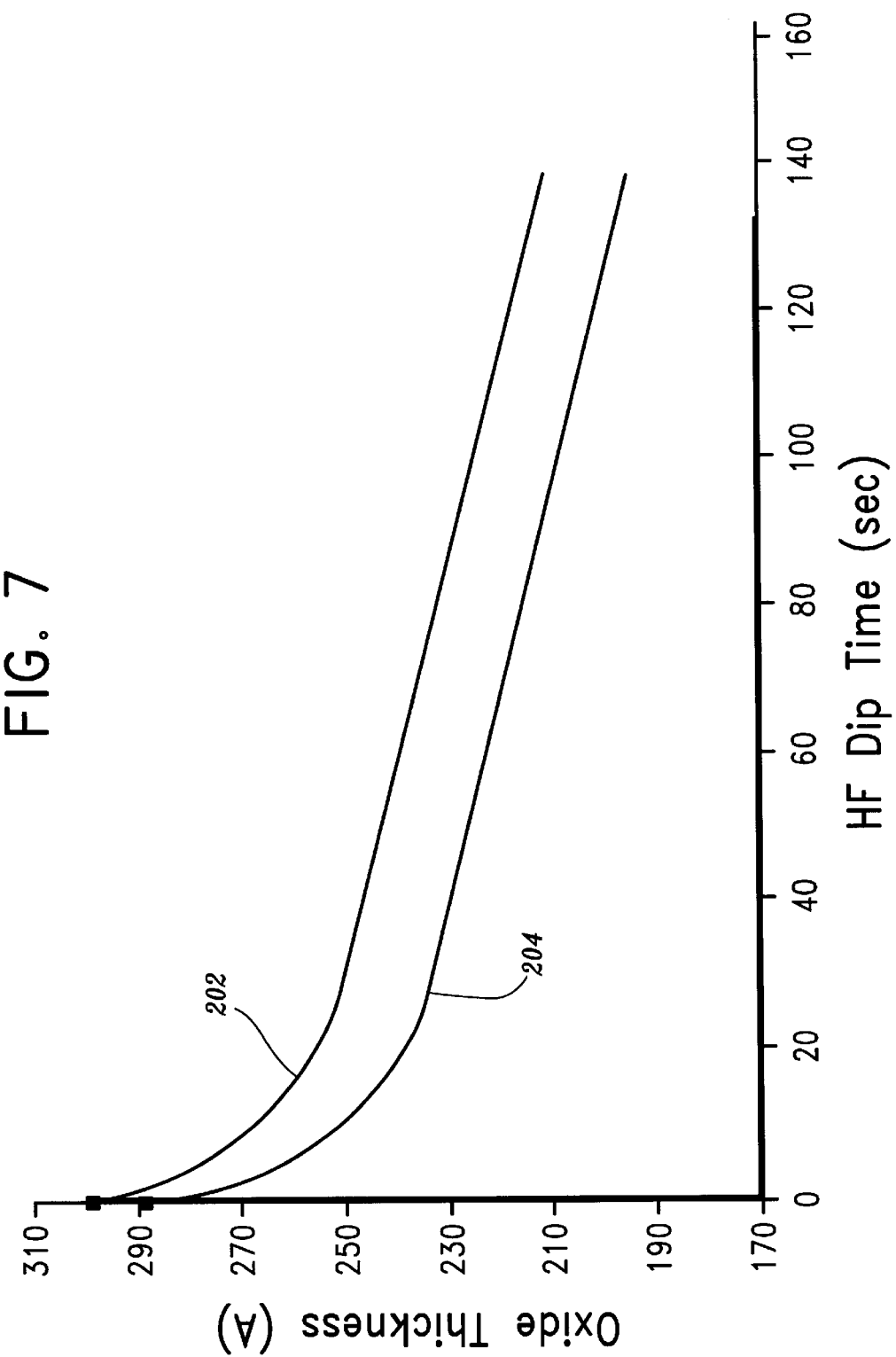
FIG. 7 is an illustrative plot of oxide thickness versus HF dip time for oxide layers subjected to a plasma condition for different times in accordance with the present invention.

Referring to FIG. 7, a plot illustratively demonstrates the effect of etching an altered oxide in accordance with the present invention. Two curves are shown in FIG. 7. Curve 202 includes an oxide with an initial thickness of about 293 Å before damaging the oxide layer in accordance with the invention. Curve 204 includes an oxide with an initial thickness of about 296 Å before damaging the oxide layer in accordance with the invention. A plasma condition was employed to damage the oxide layers. The plasma condition includes treatment for about 5 seconds in curve 202 and about 120 seconds for curve 204. Both exposure times included a flow rate of 30 sccm of HBr, 3 sccm of $O_2$ and 150 sccm of He at a pressure of about 30 milliTorr. The plasma is highly selective to silicon oxide. Thus, the oxide is not etched during plasma exposure.

FIG. 7 plots oxide thickness versus HF dip time. A diluted HF solution (100:1, water to HF) was employed at room temperature (21–25 degrees C.) As can be seen, a faster etch rate (steeper slope) is experienced at the initial stage for the damaged oxide for curves 202 and 204 which underwent 5 seconds and 120 seconds of plasma exposure, respectively. The etch rate of damaged oxide for the 120 second exposure is faster than that of the 5 second plasma exposed oxide. Identical slopes after 20 seconds of HF dipping corresponds to an identical etch rate of undamaged oxide in both curves 202 and 204.

It is to be understood that the present invention is illustratively described in terms of a semiconductor memory having a support region (or area) and an array region (or area); however, the present invention is broader and is applicable to other semiconductor devices where different processing or components are needed in different regions. Further, the invention was described in terms of an oxide formation on sidewalls. Other materials may be included and employed in accordance with the present invention. For example, silicon nitride may be used.

Having described preferred embodiments for a sidewall oxide process for improved shallow junction formation in support region (which are intended to be illustrative and not limiting), it is noted that modifications and variations can be made by persons skilled in the art in light of the above teachings. It is therefore to be understood that changes may be made in the particular embodiments of the invention disclosed which are within the scope and spirit of the invention as outlined by the appended claims. Having thus described the invention with the details and particularity required by the patent laws, what is claimed and desired protected by Letters Patent is set forth in the appended claims.

What is claimed is:

1. A method for forming dielectric protection in different regions of a semiconductor device comprising the steps of:
   forming structures in a first region and a second region;
   growing a dielectric layer on surfaces of the structures and in between the structures in the first region and the second region;
   damaging the dielectric layer in the second region without removing the dielectric layer to provide an altered layer which is etchable at a faster rate than the dielectric layer in the first region; and
   wet etching the dielectric layer in the first region and the altered layer in the second region to provide a dielectric protection layer having a first thickness in the first region and a second thickness in the second region.

2. The method as recited in claim 1, wherein the first region is an array region and the second region is a support region.

3. The method as recited in claim 1, wherein the first thickness is greater than the second thickness.

4. The method as recited in claim 1, wherein the step of growing a dielectric layer on surfaces includes the step of growing an oxide layer on sidewalls of the structures and in between the structures.

5. The method as recited in claim 1, wherein the step of damaging the dielectric layer in the second region to provide an altered layer includes the step of exposing the dielectric layer in the second region to a plasma condition.

6. The method as recited in claim 5, wherein the plasma condition includes a HBr/$O_2$ reactive ion etch.

7. The method as recited in claim 5, wherein the plasma condition smooths a surface of the dielectric layer in the second region.

8. The method as recited in claim 1, wherein the step of damaging the dielectric layer in the second region to provide an altered layer includes the step of illuminating the dielectric layer in the second region with radiation.

9. The method as recited in claim 8, wherein the radiation includes ultraviolet radiation.

10. The method as recited in claim 1, wherein the step of wet etching the dielectric layer includes the step of etching with hydrofluoric acid.

11. A method for forming dielectric protection in different regions of a semiconductor device comprising the steps of:

forming structures in a first region and a second region;

growing a first dielectric layer on surfaces of the structures and in between the structures in the first region and the second region;

damaging the first dielectric layer in the second region without removing the first dielectric layer to provide an altered layer which is etchable at a faster rate than the first dielectric layer in the first region;

wet etching the first dielectric layer in the first region to provide a first thickness in the first region and etching the altered layer to remove the altered layer from the second region; and growing a second dielectric layer having a second thickness in the second region such that the first region includes the first thickness of the first dielectric layer and the second thickness of the second dielectric layer.

12. The method as recited in claim 11, wherein the first region is an array region and the second region is a support region.

13. The method as recited in claim 11, wherein the first dielectric layer and the second dielectric layer include an oxide layer.

14. The method as recited in claim 11, wherein the step of damaging the first dielectric layer in the second region to provide an altered layer includes the step of exposing the first dielectric layer in the second region to a plasma condition.

15. The method as recited in claim 14, wherein the plasma condition includes a $HBr/O_2$ reactive ion etch.

16. The method as recited in claim 14, wherein the plasma condition smooths a surface of the first dielectric layer in the second region.

17. The method as recited in claim 11, wherein the step of damaging the first dielectric layer in the second region to provide an altered layer includes the step of illuminating the first dielectric layer in the second region with radiation.

18. The method as recited in claim 17, wherein the radiation includes ultraviolet radiation.

19. The method as recited in claim 11, wherein the step of wet etching includes the step of etching with hydrofluoric acid.

20. A method for forming protective oxides in an array region and a support region of a semiconductor memory comprising the steps of:

providing a semiconductor substrate having a gate oxide layer formed thereon;

patterning gate stacks in the support region and in the array region;

oxidizing the gate stacks and the gate oxide layer to form a sidewall oxide on lateral surfaces of the gate stacks and increase a thickness of the gate oxide layer between the gate stacks;

forming a resist over the array region;

damaging the sidewall oxide and the gate oxide layer in the support region without removing the sidewall oxide and the gate oxide layer to provide an altered layer which is etchable at a faster rate than the sidewall oxide and the gate oxide layer in the array region;

removing the resist; and wet etching the sidewall oxide and the gate oxide layer in the array region and the altered layer in the support region to provide a dielectric protection layer having a first thickness in the array region and a second thickness in the support region.

21. The method as recited in claim 20, wherein the first thickness is greater than the second thickness.

22. The method as recited in claim 20, wherein the step of damaging the sidewall oxide and the gate oxide layer in the support region to provide an altered layer includes the step of exposing the sidewall oxide and the gate oxide layer in the support region to a plasma condition.

23. The method as recited in claim 22, wherein the plasma condition includes a $HBr/O_2$ reactive ion etch.

24. The method as recited in claim 22, wherein the plasma condition smooths a surface of the sidewall oxide and the gate oxide layer in the support region.

25. The method as recited in claim 1, wherein the step of damaging the sidewall oxide and the gate oxide layer in the support region to provide an altered layer includes the step of illuminating the sidewall oxide and the gate oxide layer in the support region with radiation.

26. The method as recited in claim 25, wherein the radiation includes ultraviolet radiation.

27. The method as recited in claim 20, wherein the step of wet etching includes the step of etching with hydrofluoric acid.

* * * * *